United States Patent [19]

Fay et al.

[11] Patent Number: 4,667,121
[45] Date of Patent: May 19, 1987

[54] INTEGRATED CIRCUIT SPEED CONTROLLER

[75] Inventors: Gary Fay, Scottsdale; Jeffrey G. Mansmann, Chandler; Keith M. Wellnitz, Scottsdale, all of Ariz.

[73] Assignee: Motorola, Inc., Schaumburg, Ill.

[21] Appl. No.: 866,651

[22] Filed: May 27, 1986

[51] Int. Cl.⁴ .................... H03K 17/687; H03K 17/14
[52] U.S. Cl. ................... 307/580; 307/303; 307/304; 307/310
[58] Field of Search ............... 307/580, 310, 303, 304; 318/254, 138

[56] References Cited

U.S. PATENT DOCUMENTS

| | | | |
|---|---|---|---|
| 4,283,638 | 8/1981 | Kompelien | 307/580 |
| 4,360,783 | 11/1982 | Nagasawa et al. | 307/304 |
| 4,449,067 | 5/1984 | Nishikawa | 307/580 |

Primary Examiner—John S. Heyman
Attorney, Agent, or Firm—Joe E. Barbee

[57] ABSTRACT

A speed control circuit made by using CMOS processes is capable of handling high voltage and high current loads. The output of the speed control circuit is provided by a power field effect transistor. Current sensing means are provided to generate a fault signal in case an over current condition occurs. The junction temperature of the power field effect transistor is also monitored to provide an over temperature condition if the temperature of the junction of the power field effect transistor exceeds a predetermined value. A ramping generator is used to set a latch which controls the operation of the power field effect transistor. A speed control signal is compared against the ramping signal provided by the ramp generator and resets the latch in order to provide speed control.

5 Claims, 1 Drawing Figure

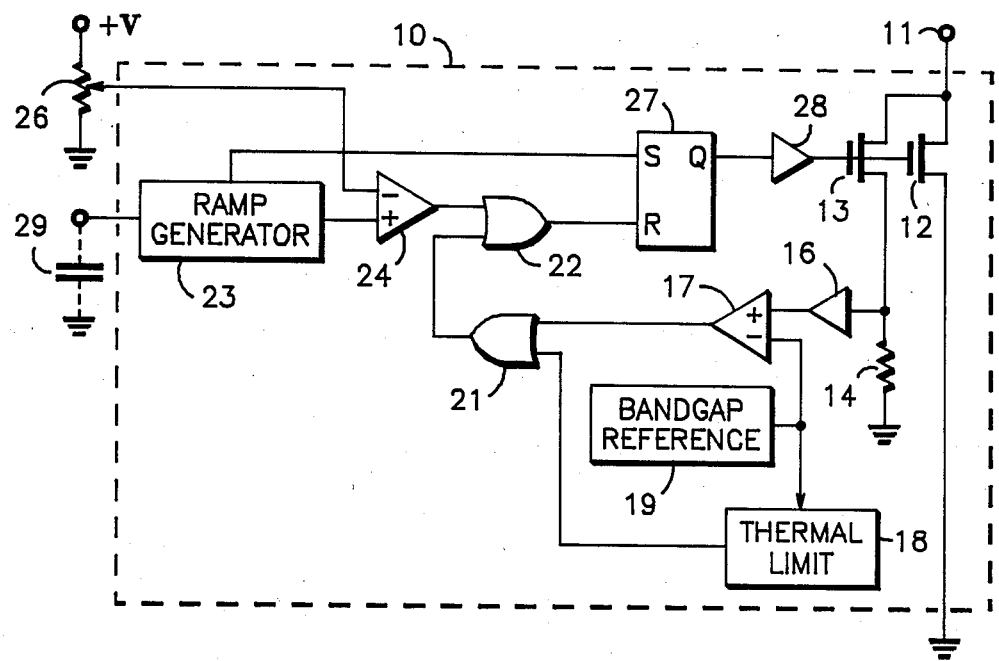

INTEGRATED CIRCUIT SPEED CONTROLLER

BACKGROUND OF THE INVENTION

This invention relates, in general, to speed control circuits, and more particularly, to an integrated circuit speed controller particularly useful for controlling the speed of a direct current component.

It is well known that SCRs are well suited as speed controllers for alternating current motors. Well known speed controllers for direct current motors are not as refined as speed controllers for alternating current motors. As an example, potentiometers or dropping resistors have been used to control the speed of direct current motors. This is highly inefficient since the potentiometer or resistor dissipates a considerable amount of power. Of course, a speed controller for a direct current motor could be built from discrete semiconductor devices; however, such a speed controller would be rather large and expensive due to the amount of labor required to assemble such a controller. In addition, such a controller would not necessarily have the capability of over current and over temperature protection. Therefore, it would be desirable to have a direct current motor speed controller built on a single integrated circuit chip.

Accordingly, it is an object of the present invention to provide an improved monolithic integrated circuit speed controller.

Another object of the present invention is to provide an integrated circuit speed controller useful for controlling the speed of a direct current component and which has self-contained over current and over temperature protection.

Yet another object of the present invention is to provide an integrated circuit speed controller which can be manufactured using CMOS processes.

SUMMARY OF THE INVENTION

The above and other objects and advantages of the present invention are provided by a single integrated circuit chip having a power field effect transistor. A smaller field effect transistor is used in sensing the current flowing through the power field effect transistor. The power field effect transistor can controllably switch power on and off to a DC component or load connected in series with the power field effect transistor. The current monitored by the smaller field effect transistor is compared against a predetermined reference and an over current indication is provided in case the monitored current exceeds a predetermined level. The integrated circuit chip also has a thermal limit circuit which monitors the temperature of the integrated circuit chip. Since the power field effect transistor consumes the largest amount of area on the chip the temperature monitored by the thermal limit is an indication of the junction temperature of the power field effect transistor. A ramp generator is used to provide a ramp signal as well as a very narrow pulse. The very narrow pulse is used to set a logic means at a predetermined state. The ramp voltage is compared against a speed control signal to provide an output which can reset the state of the logic means. The over current signal as well as the over temperature signal can also reset the logic means. The output of the logic means provides an enabling signal which is coupled to the field effect transistors to control the operation of the field effect transistors.

The subject matter which is regarded as the invention is set forth in the appended claims. The invention itself, however, together with further objects and advantages thereof, may be better understood by referring to the following detailed description taken in conjunction with the accompanying drawing.

BRIEF DESCRIPTION OF THE DRAWING

The single FIGURE illustrates in block diagram form an embodiment of the present invention.

DETAILED DESCRIPTION OF THE DRAWING

Integrated circuit 10 is made on a single semiconductor chip and is intended to control a high voltage, such as a 100 volts, at a high current, such as 20 amps. Accordingly, field effect transistor 12 is a power field effect transistor capable of carrying high currents at a high voltage. The drain electrode of transistor 12 is connected to a terminal 11. The device or component whose speed is to be controlled will be connected to terminal 11 and to a power supply. The source of transistor 12 is connected to ground. When transistor 12 is enabled then current will flow through the device whose speed is being controlled. Field effect transistor 13 has a drain electrode connected to the drain electrode of transistor 12 and a gate electrode connected to the gate electrode of transistor 12. The source of transistor 13 is connected to an input of an amplifier 16 and is also coupled to ground through a resistor 14. In a preferred embodiment, transistors 12 and 13 actually comprise a plurality of small field effect transistors connected in parallel. As an example, transistor 12, in one embodiment, comprises 9,205 transistors connected in parallel while transistor 13 comprises six small transistors connected in parallel. The majority of the current flowing through terminal 11 flows through transistor 12 with a very small amount flowing through transistor 13. This small amount of current also flows through resistor 14, which in one embodiment has a value of approximately 15 ohms. The voltage developed across resistor 14 is amplified by amplifier 16 and provided to a first input of a comparator 17. A second input of comparator 17 is a reference voltage provided by a voltage reference circuit 19. In a preferred embodiment voltage reference generator 19 is a bandgap voltage generator.

A thermal limit circuit 18 is provided on integrated circuit 10 to monitor the temperature of the circuit. The temperature of the integrated circuit or chip will be essentially established by power transistor 12 since power field effect transistor 12 occupies a large portion of the chip area. Therefore, thermal limit circuit 18 will essentially be monitoring the junction temperature of power transistor 12. The voltage for thermal limit circuit 18 is provided by bandgap reference generator 19 which provides a voltage which is stable and independent of temperature variations. Thermal limit circuit 18 provides an over temperature signal to an input of a dual input OR gate 21. A second input of dual input OR gate 21 is received from the output of comparator 17. The output of OR gate 21 is connected to an input of a dual input OR gate 22.

A ramp generator 23 provides a ramping signal to an input of a comparator 24. Ramp generator 23 also provides a narrow pulse which is generated at the beginning of the upward slope of the output ramping signal. The short pulse is used as a set pulse for a flip-flop 27. Flip-flop 27 is used to prevent uncontrolled enablement of transistors 12 and 13 during fault conditions. This uncontrolled enablement is commonly called double pulse suppression. Ramp generator 23 is illustrated as having a capacitor terminal extending off of integrated circuit 10. A capacitor 29 is illustrated in phantom as being connected to ramp generator 23 to provide frequency control for the ramp generator. This allows the user of integrated circuit 10 to select his own desired operating frequency. Capacitor 29 could just as easily be integrated on integrated circuit 10 if the desired operating frequency of ramp generator 23 is known before the manufacture of integrated circuit 10.

Also external to integrated circuit 10 is a potentiometer 26 which is connected between a positive voltage supply and ground. The potentiometer supplies the speed control input signal to integrated circuit 10. This input speed control signal is connected to a second input of comparator 24 wherein it is compared against the ramping signal generated by ramp generator 23. Ramp generator 23 provides an output ramping signal which has a substantially fixed maximum and minimum values. If the input speed control signal coming from potentiometer 26 is at a greater value than the maximum peak reached by the ramping signal then the output of comparator 24 will remain a low value. This low value signal is connected to an input of OR gate 22 and will not cause OR gate 22 to provide a reset output. However, if the speed control voltage is set at a low level comparator 24 will provide a high output when the amplitude of the ramping signal exceeds the low level of the speed control signal. This high output from comparator 24 will cause OR gate 22 to provide a reset pulse to flip-flop 27 which thereby causes the Q output of flip-flop 27 to go to a low value. The Q output of flip-flop 27 is coupled through a buffer driver 28 to the gate electrodes of transistors 12 and 13. If the Q output is low then transistors 12 and 13 will not be enabled. When the Q output of flip-flop 27 is a high level transistors 12 and 13 will be enabled. Note that an over current signal or an over temperature signal on the inputs of OR gate 21 will cause OR gate 21 to provide a high level signal to one of the inputs of OR gate 22 which in turn will cause a reset pulse to be generated. This reset pulse will reset flip-flop 27 thereby disabling transistors 12 and 13.

In a preferred embodiment of integrated circuit 10 an on chip voltage regulator will be provided so that the voltage used to power ramp generator 23 and bandgap reference generator 19 will be a regulated voltage. This is useful to prevent noise generated by the load or the component connected to terminal 11, through the switching action of power transistor 12, from entering the power supply of ramp generator 23 and bandgap reference generator 19. In addition, ramp generator 23 is referenced to the same ground as potentiometer 26.

By now it should be appreciated that there has been provided a new and improved speed controller integrated circuit useful as a DC motor speed controller which can be entirely integrated by using CMOS processes. The speed controller is integrated on a single semiconductor chip and has built in over current and over temperature protection capability. An over current condition will provide a logic level 1 at the input of OR gate 21. An over temperature condition will also provide a logic level 1 at the input of OR gate 21. Either one of these inputs being at a logic level 1 will cause a logic level 1 output from OR gate 21. The logic level 1 output from OR gate 21 is connected to an input of OR gate 22. The logic level 1 input on OR gate 22 will cause a logic level 1 output from OR gate 22 which will reset flip-flop or latch 27. Resetting latch 27 causes the Q output to go to a low level which is coupled by buffer driver 28 to the gate electrodes of transistors 12 and 13. The low level on the gate electrodes of transistors 12 and 13 will not enable these transistors. Ramp generator 23 generates a set pulse at the beginning of each upward sloping ramp signal. This set pulse will set latch 27 so that its Q output is a high level thereby enabling transistors 12 and 13. However, if an over temperature or an over current condition exists latch 27 is reset. Accordingly, speed controller circuit 10 continuously self-checks to verify whether the over current or over temperature condition has been removed.

Assuming that no over temperature or over current conditions exist the output of OR gate 21 will be at a logic level 0 which does not cause an output from OR gate 22. Therefore, when the set pulse provided by ramp generator 23 sets latch 27 it will remain set unless the output of comparator 24, which is coupled by OR gate 22 to the reset input of latch 27, causes latch 27 to be reset. If the input from the speed control signal which is applied to the inverting input of comparator 24 is at an amplitude which exceeds the maximum amplitude reached by the ramping signal provided by ramp generator 23 to the non-inverting input of comparator 24 then the output of comparator 24 will remain at a low level which will not cause latch 27 to reset and the load or component connected to terminal 11 will operate at full speed. If the speed control signal applied to the inverting input of comparator 24 is set at a low level then the output of comparator 24 will be driven to a high level when the ramping signal exceeds that low level thereby causing latch 27 to be reset and removing power from the load connected to terminal 11.

We claim:

1. An integrated circuit speed controller having a controllable power field effect transistor, comprising: a current sense field effect transistor for monitoring the current flowing through the power field effect transistor; a resistor connected in series with the current sense field effect transistor and providing a voltage proportional to current monitored; an amplifier for amplifying the proportional voltage; a first comparator for comparing the amplified proportional voltage to a reference voltage and providing an output when the amplified proportional voltage exceeds the reference voltage; a thermal limit circuit for providing an over temperature signal when the temperature of the integrated circuit exceeds a predetermined limit; means for providing a fault signal when the output of the first comparator or the over temperature signal is present; a ramp generator for providing a ramp signal and a set pulse; a flip-flop for being set to a first state by the set pulse and providing an output; a second comparator receiving the ramp signal at a first input and receiving a control voltage at a second input and providing an output to reset the flip-flop; and a buffer driver coupled to the output of the flip-flop and in response to such output providing an enabling signal to the power field effect transistor and to the current sense field effect transistor.

2. The integrated circuit speed controller of claim 1 further including logic means for receiving the fault signal and the output of the second comparator and providing the reset signal to the flip-flop when either the fault signal or the output of the second comparator is present.

3. A monolithic integrated circuit for controlling speed of a component powered by a direct current, comprising: a power field effect transistor for controllably switching on and off the direct current; a current sensing field effect transistor for controllably switching a small portion of the direct current; first means coupled to the current sensing field effect transistor for providing an over current limit signal when the small portion of the direct current exceeds a predetermined value; a thermal limit circuit for sensing temperature of the monolithic integrated circuit and providing an over temperature limit when the temperature exceeds a predetermined value; a ramp generator for providing a ramp signal and a pulse output; second means coupled to the ramp generator for receiving the ramp signal and providing a predetermined output depending on the ratio of the ramp signal to a speed control signal; and logic means for providing an enabling output in response to the pulse output from the ramp generator and inhibiting the enabling output in response to the over current limit signal, the over temperature limit, or the predetermined output of the second means.

4. The monolithic integrated circuit of claim 3 further including a bandgap reference generator for providing a temperature stable voltage to the thermal limit circuit, and for providing a stable reference voltage to the first means.

5. The monolithic integrated circuit of claim 3 further including an OR gate for combining the over temperature limit and the over current limit signal.

* * * * *